United States Patent [19]

Koizumi et al.

[11] Patent Number: 4,658,104
[45] Date of Patent: Apr. 14, 1987

[54] PRINTED WIRING BOARD

[75] Inventors: Haruyuki Koizumi; Koichi Omae, both of Kyoto, Japan

[73] Assignee: Omron Tateisi Electronics Co., Kyoto, Japan

[21] Appl. No.: 724,862

[22] Filed: Apr. 19, 1985

[30] Foreign Application Priority Data

Apr. 19, 1984 [JP]  Japan ............................ 59-57983[U]

[51] Int. Cl.⁴ ........................... H01R 9/09; H01H 3/12
[52] U.S. Cl. ............................... 200/159 B; 339/17 F; 200/292
[58] Field of Search ................. 339/17 R, 17 C, 17 E, 339/17 F, 17 T, 17 D, 176 MF; 361/406, 408, 414; 29/837, 845; 200/159 B, 292

[56] References Cited

U.S. PATENT DOCUMENTS 2,869,040  1/1959  Pifer ..................................... 361/406
2,999,895  9/1961  Smith ................................. 339/17 C
3,365,694  1/1968  Parker ................................ 339/17 F
4,187,388  2/1980  Roberts ............................. 339/17 C

OTHER PUBLICATIONS

IBM Bulletin, Roche et al., vol. 6, No. 8, p. 87, 1-1964.

Primary Examiner—Neil Abrams
Attorney, Agent, or Firm—Wegner & Bretschneider

[57]  ABSTRACT

A printed wiring board comprising a supporting frame, a resilient sheet supported by the supporting frame and having a wiring pattern formed thereon, and a tongue member made of the resilient sheet and providing the wiring pattern formed thereon; the supporting frame having a escape space formed therein corresponding to the tongue member; the terminal of an electronic device being pressed against the wiring pattern of the tongue member in such a manner that the restoring force of the tongue member completes the electrical connection between the wiring pattern and the terminal of the electronic device.

5 Claims, 4 Drawing Figures

PRINTED WIRING BOARD

BACKGROUND OF THE INVENTION

This invention relates to a printed wiring board and more particularly to an improved board which is used for connecting electronic and electric devices thereto.

It is well known to use polyester sheets as board materials and to provide wiring patterns by printing silver or carbon paste on the board or by applying etching to an aluminum evaporation layer.

FIGS. 3 and 4 show conventional connectors employing the polyester sheets.

The polyester sheets have poor characteristics with respect to heat-resistance and soldering, so that as illustrated in FIG. 3, an electronic device 83 is usually connected to a printed wiring board 8 through hole 81 formed therein. A wiring pattern 82 extends through the hole 81 to the back surface 82' of the board 8 where the terminal 84 of the electronic device 83 inserted into the hole 81 is soldered to the pattern 82.

In this structure, however, the printed wiring board is required to have its both sides printed, which leads to high manufacturing cost compared to one side printed board. To solve such a problem, there is proposed a printed wiring board 9 which has two holes 91 and 92 adjacent to each other as shown in FIG. 4. The terminal 94 of an electronic device 93 is inserted in the hole 91 and then is folded so as to be inserted again in the hole 92, projecting out of the front surface 95 of the board 9 in such a manner that the end of the terminal 94 is soldered to a wiring pattern. Such a prior art device, however, requires a number of laborious processes of providing the holes in the board 9 and folding the terminal 94.

It is therefore an object of this invention to provide a printed wiring board which completes electrical connection without soldering.

It is a further object of this invention to provide an improved board which completes electrical connection by means of the restoring force of a resilient sheet.

DETAILED DESCRIPTION

Figure 1:
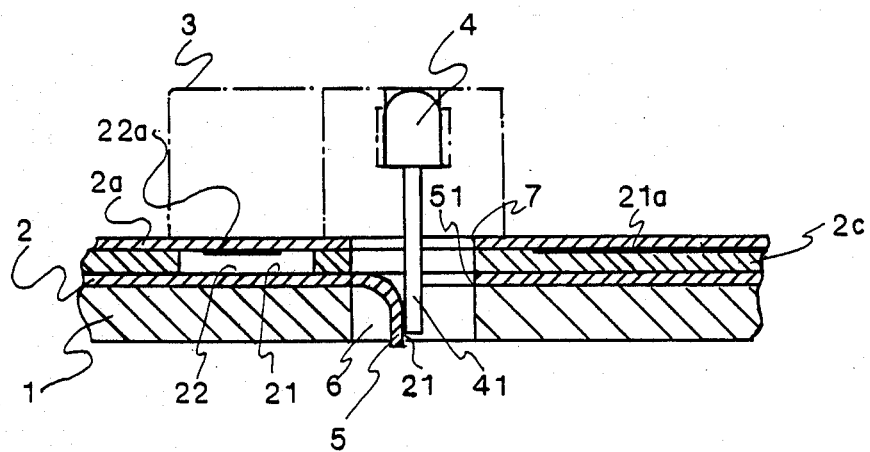
FIG. 1 shows a cross-sectional view of a printed wiring board as a preferred embodiment of this invention.

Referring now to FIG. 1, there is shown a printed wiring board as a preferred embodiment of this invention. A frame 1 is made of synthetic resin, aluminum, or iron board, upon which a pair of flexible and resilient sheets 2 and 2a made of polyester are supported. The flexible sheets have printed wiring pattern 21 and 21a formed thereon.

An insulation spacer 2c is inserted between the sheets 2 and 2a so that an appropriate distance is provided between a pair of contacts 22 and 22a which are electrically connected upon the actuation of a key plunger 3.

A light emitting diode 4 emits light in response to the depression of a key (not shown), which enables an operator to confirm if his operation is correctly performed. The connector of this embodiment consists of a portion of the sheet 2 which is cut out of the sheet 2 along a cut line 51 and bent to form a tongue 5. The upper surface of the sheet 2 has printed stationary contacts 21 and 22 thereon, while the lower surface of the sheet 2a has printed a movable contact 22a as well as wiring pattern 21a. The wiring pattern 21' electrically connected with the stationary contact 21 is formed on the upper surface of the tongue 5.

The terminal 41 of the light emitting diode 4 is inserted through the cutout 7 of the sheet 2a. The terminal puts a force against the tongue 5 and bends it against the restoring force so that the terminal 41 is electrically connected to the wiring pattern 21' printed on the tongue. The tongue is bent toward the escape space 6 which is made by cutting out the frame 1.

Figure 2:
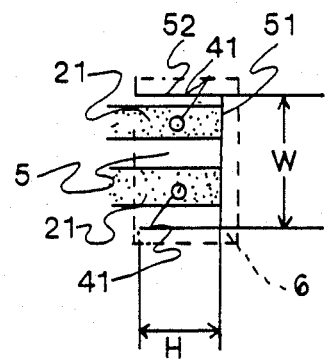
FIG. 2 shows a partial plan view of a flexible sheet of FIG. 1.
Figure 3:
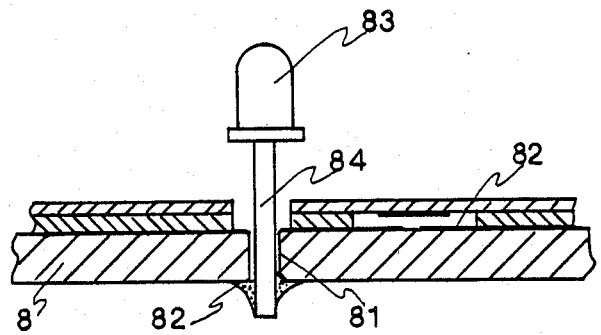
FIG. 3 shows a conventional board.
Figure 4:
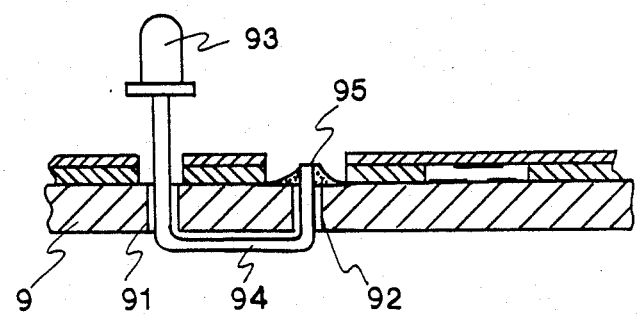
FIG. 4 shows another conventional board.

FIG. 2 shows a plan view of the tongue 5. In this embodiment, the width W of the tongue 5 is made to be longer than its length H, so that the elastic force of the tongue 5 is increased and the wiring pattern 21' is formed apart from the edge 52 of the tongue 5 in view of insulation. It will be apparent from the above description that an electrical connection can be easily attained without soldering; in other words, the process of completing an electrical connection can be simplified.

Although the present invention has been described by way of example with reference to the attached drawings, it is to be noted that various changes and modifications are apparent to those skilled in the art. Therefor, unless otherwise such changes and modifications depart from the scope of the invention, they should be construed as included therein.

What is claimed is:

1. A printed wiring board, comprising:
   (a) a supporting frame;
   (b) a first non-conductive resilient sheet supported by the supporting frame and having a tongue member formed therein, a first wiring pattern formed on the first non-conductive resilient sheet and the tongue member including a stationary contact;
   (c) a second non-conductive resilient sheet having a second wiring pattern formed thereon including a movable contact corresponding to the stationary contact; and
   (d) an insulating spacer interposed between the first and second non-conductive resilient sheets and supporting the second sheet at a predetermined distance from the first sheet, formed with an aperture therein located such that the movable contact forms an electrical connection with the stationary contact when a force is applied to the second non-conductive resilient sheet over the aperture;
   the supporting frame having an escape space formed therein corresponding to the tongue member whereby the terminal of an electronic device is adapted to be pressed against the first wiring pattern of the tongue member in such a manner that the restoring force of the tongue member completes the electrical connection between the first wiring pattern and the terminal of the electronic device.

2. A printed wiring board according to claim 1, wherein said escape space is an opening.

3. A printed wiring board according to claim 1, wherein said tongue member has a width which is longer than its length.

4. The printed wiring board according to claim 1, wherein said first non-conductive resilient sheet is polyester.

5. The printed wiring board according to claim 3, wherein said tongue member is smaller in width and length than said escape space.

* * * * *